United States Patent
Sugawara et al.

(10) Patent No.: US 9,689,656 B2
(45) Date of Patent: Jun. 27, 2017

(54) WORKPIECE HOLDER AND METHOD USING SAME FOR DETECTING LATERAL DISPLACEMENT OF WORKPIECE

(71) Applicant: CREATIVE TECHNOLOGY CORPORATION, Kawasaki-shi, Kanagawa (JP)

(72) Inventors: Toshifumi Sugawara, Kawasaki (JP); Eunsun Kim, Kawasaki (JP); Yoshiaki Tatsumi, Kawasaki (JP)

(73) Assignee: CREATIVE TECHNOLOGY CORPORATION, Kawasaki-Shi (JP)

( * ) Notice: Subject to any disclaimer, the term of this patent is extended or adjusted under 35 U.S.C. 154(b) by 260 days.

(21) Appl. No.: 14/434,805

(22) PCT Filed: Oct. 1, 2013

(86) PCT No.: PCT/JP2013/076737
§ 371 (c)(1),
(2) Date: Apr. 10, 2015

(87) PCT Pub. No.: WO2014/057843
PCT Pub. Date: Apr. 17, 2014

(65) Prior Publication Data
US 2015/0268026 A1 Sep. 24, 2015

(30) Foreign Application Priority Data
Oct. 11, 2012 (JP) .................................. 2012-225830

(51) Int. Cl.
*G01B 7/00* (2006.01)
*H01L 21/67* (2006.01)
(Continued)

(52) U.S. Cl.
CPC ............. *G01B 7/002* (2013.01); *G01B 7/003* (2013.01); *G01B 7/02* (2013.01); *G01D 5/24* (2013.01);
(Continued)

(58) Field of Classification Search
CPC .......... G01B 7/002; G01B 7/003; G01B 7/02; G01D 5/24; G01D 5/2412; H01L 21/67259; H01L 21/673
(Continued)

(56) References Cited

U.S. PATENT DOCUMENTS 4,920,660 A * 5/1990 Nagasawa ................ B23Q 1/36
33/568
5,351,412 A * 10/1994 Furuhata .................. B23Q 1/34
33/1 M
(Continued)

FOREIGN PATENT DOCUMENTS

| JP | 9-330975 A | 12/1997 |
|---|---|---|
| JP | 11-87228 A | 3/1999 |

(Continued)

OTHER PUBLICATIONS

English translation of International International Preliminary Report on Patentability and Written Opinion mailed Apr. 23, 2015, in PCT International Application No. PCT/JP2013/076737.
(Continued)

*Primary Examiner* — Yaritza Guadalupe-McCall
(74) *Attorney, Agent, or Firm* — Birch, Stewart, Kolasch & Birch. LLP (57) ABSTRACT

Provided are a workpiece holding apparatus capable of detecting lateral displacement of a workpiece (w) in a planar direction, and a method of detecting lateral displacement of a workpiece (w) with use of the workpiece holding apparatus. The workpiece holding apparatus, which is configured
(Continued)

to hold the workpiece (w), with an adhesive pad (2) mounted on a support plate, includes: a capacitance measuring device (5) including an electrode pair formed of first and second electrodes (3a, 3b) and arranged at least at a part of a position corresponding to a peripheral edge portion of the workpiece (w), the capacitance measuring device (5) being configured to measure capacitance of the electrode pair; and a comparator circuit (6) configured to compare the measured capacitance with a predetermined reference value, to thereby detect lateral displacement of the workpiece (w) in a planar direction of the support plate (1). Further, the method of detecting lateral displacement of a workpiece (w) includes comparing the capacitance input to the comparator circuit (6) with a predetermined reference value, to thereby detect the lateral displacement of the workpiece (w).

9 Claims, 6 Drawing Sheets (51) Int. Cl.
  G01B 7/02 (2006.01)
  G01D 5/24 (2006.01)
  H01L 21/673 (2006.01)
  G01D 5/241 (2006.01)
(52) U.S. Cl.
  CPC ...... H01L 21/673 (2013.01); H01L 21/67259 (2013.01); *G01D 5/2412* (2013.01)
(58) Field of Classification Search
  USPC .......................................................... 33/568
  See application file for complete search history.

(56) References Cited

U.S. PATENT DOCUMENTS

| | | | |
|---|---|---|---|
| 5,794,080 A * | 8/1998 | Watanabe .......... | G01C 19/5649 73/504.12 |
| 6,075,375 A * | 6/2000 | Burkhart .......... | H01L 21/67259 324/662 |
| 6,160,338 A | 12/2000 | Ono | |
| 6,333,572 B1 | 12/2001 | Ono | |
| 6,377,060 B1 * | 4/2002 | Burkhart .......... | H01L 21/67259 324/662 |
| 6,417,743 B1 * | 7/2002 | Mihailovich .......... | H03H 9/462 333/186 |
| 8,870,818 B2 * | 10/2014 | Alderete, Jr. ...... | G01R 33/0035 324/750.16 |
| 9,317,164 B2 * | 4/2016 | Suwald .................. | G06F 3/044 |
| 2003/0071981 A1 * | 4/2003 | Ueta .................. | G03F 7/70725 355/72 |
| 2005/0140378 A1 | 6/2005 | Hirota et al. | |
| 2005/0167036 A1 | 8/2005 | Yokoyama et al. | |
| 2009/0185088 A1 | 7/2009 | Shinohara | |
| 2012/0114456 A1 | 5/2012 | Musha et al. | |
| 2012/0224945 A1 | 9/2012 | Douki et al. | |
| 2014/0163664 A1 * | 6/2014 | Goldsmith ....... | A61B 17/00491 623/1.11 |
| 2015/0091589 A1 * | 4/2015 | Zibold .................. | G01V 3/088 324/679 |
| 2015/0268026 A1 * | 9/2015 | Sugawara ........ | H01L 21/67259 33/568 |

FOREIGN PATENT DOCUMENTS

| | | |
|---|---|---|
| JP | 2000-228440 A | 8/2000 |
| JP | 2003-303875 A | 10/2003 |
| JP | 2009-169330 A | 7/2009 |
| JP | 2011-150455 A | 8/2011 |
| JP | 2012-38922 A | 2/2012 |
| JP | 2012-60175 A | 3/2012 |
| JP | 2012-182393 A | 9/2012 |
| WO | WO 2010/113485 A1 | 10/2010 |

OTHER PUBLICATIONS

International Search Report, issued in PCT/JP2013/076737, dated Jan. 7, 2014.

* cited by examiner

LATERAL DISPLACEMENT:
OCCURRED/NOT OCCURRED

CORRECT POSITION

WORKPIECE HOLDER AND METHOD USING SAME FOR DETECTING LATERAL DISPLACEMENT OF WORKPIECE

TECHNICAL FIELD

The present invention relates to a workpiece holding apparatus and a method of detecting lateral displacement of a workpiece with use of the workpiece holding apparatus. More specifically, the present invention relates to a workpiece holding apparatus capable of detecting, when a workpiece (product to be attracted) is held, lateral displacement of the workpiece in a planar direction of a support plate, and to a method of detecting lateral displacement of a workpiece with use of the workpiece holding apparatus.

BACKGROUND ART

When a flat panel display using a liquid crystal panel, a plasma panel, an OLED panel, or the like is manufactured or when a semiconductor substrate is manufactured, a workpiece holding apparatus configured to hold a workpiece such as a glass substrate or the semiconductor substrate is widely used during each process or during transfer of the workpiece between the processes. Further, also when a solar cell apparatus, an OLED apparatus, or the like is manufactured, the workpiece holding apparatus configured to hold a workpiece such as a film or a resin substrate is used.

There are various types of workpiece holding apparatus, such as a workpiece holding apparatus incorporated in advance in a liquid crystal panel manufacturing apparatus or the like and a robot hand-type workpiece holding apparatus configured to move and place the workpiece onto each apparatus during each process. In accordance therewith, as means for holding the workpiece by the workpiece holding apparatus, there are known, for example, a vacuum suction system and an electrostatic chuck system using an electrostatic attraction force. Considering such advantages that the workpiece can be held at substantially a constant force regardless of the material of the workpiece, any processing or environment is selectable (for example, in a situation where vacuum processing is necessary, the vacuum suction system cannot be employed), and the amount of routing of a suction hose, electrical wiring, or the like is relatively small, there is used a workpiece holding apparatus configured to hold the workpiece with an adhesive pad mounted on a support plate.

Regardless of the above-mentioned means for holding the workpiece, one of the requirements shared by the workpiece holding apparatus is determination on whether or not the workpiece is normally held. Under a state in which the holding force for the workpiece is insufficient, the workpiece may not be correctly processed, which may cause falling of the workpiece and stopping of the manufacturing line in the worst case. In view of this, there is known a method of measuring, in the workpiece holding apparatus configured to hold a substrate (workpiece) by employing the electrostatic chuck system or the like, capacitance between the workpiece holding apparatus and the workpiece held by the workpiece holding apparatus, and comparing the measured capacitance with a predetermined reference value, to thereby detect the state in which the workpiece holding force is insufficient (for example, see Patent Literature 1).

CITATION LIST

Patent Literature

[PTL 1] JP 2000-228440 A

SUMMARY OF INVENTION

Technical Problem

However, the main object of the related art based on the capacitance is to detect whether or not the workpiece holding force is insufficient, and no consideration is particularly made on the detection of the lateral displacement of the workpiece. For example, according to the invention disclosed in Patent Literature 1, the capacitance is measured with use of an electrode of an electrostatic chuck configured to attract and hold substantially the entire surface of the workpiece, to thereby detect the attraction state of the workpiece in the front-back surface direction of the workpiece (direction perpendicular to the workpiece holding surface). Hence, the lateral displacement of the workpiece in the planar direction (horizontal direction of the workpiece holding surface) is not detected, and even when detection is attempted, the lateral displacement cannot be correctly determined. Hitherto, the lateral displacement of the workpiece has been mainly addressed as a problem of a positional accuracy (machine accuracy) of the workpiece holding apparatus or a transfer apparatus configured to receive or pass the workpiece. Further, for example, the lateral displacement of the workpiece may be inspected by means of camera images or the like from the outside, but the workpiece holding apparatus itself has not been able to detect the lateral displacement of the workpiece.

In view of this, the inventors of the present invention have earnestly conducted studies so as to solve the above-mentioned problem and found that the lateral displacement of the workpiece in the planar direction can be detected by arranging, in the workpiece holding apparatus, an electrode pair formed of first and second electrodes at a position corresponding to a peripheral edge portion of the workpiece, and by measuring the capacitance between the first and second electrodes. Thus, the present invention is attained.

Therefore, the present invention has an object to provide a workpiece holding apparatus capable of detecting lateral displacement of a workpiece in a planar direction by the workpiece holding apparatus.

Further, the present invention has another object to provide a method of detecting lateral displacement of a workpiece, which is capable of easily and instantaneously detecting the lateral displacement of the workpiece in the planar direction in the workpiece holding apparatus.

Solution to Problem

That is, according to one embodiment of the present invention, there is provided a workpiece holding apparatus, which is configured to hold a workpiece with an adhesive pad mounted on a support plate, the workpiece holding apparatus including: a capacitance measuring device including an electrode pair formed of first and second electrodes and arranged at least at a part of a position corresponding to a peripheral edge portion of the workpiece, the capacitance measuring device being configured to measure capacitance of the electrode pair; and a comparator circuit configured to compare the measured capacitance with a predetermined reference value, to thereby detect lateral displacement of the workpiece in a planar direction of the support plate.

Further, according to one embodiment of the present invention, there is provided a method of detecting lateral displacement of a workpiece in a planar direction of a support plate in a workpiece holding apparatus configured to hold the workpiece with an adhesive pad mounted on the support plate, the workpiece holding apparatus including: a capacitance measuring device including an electrode pair formed of first and second electrodes and arranged at least at a part of a position corresponding to a peripheral edge portion of the workpiece, the capacitance measuring device being configured to measure capacitance of the electrode pair; and a comparator circuit configured to input the measured capacitance, the method including comparing the capacitance input to the comparator circuit with a predetermined reference value, to thereby detect the lateral displacement of the workpiece.

The workpiece holding apparatus according to the one embodiment of the present invention includes the capacitance measuring device including the electrode pair formed of the first and second electrodes and arranged at least at a part of the position corresponding to the peripheral edge portion of the workpiece, the capacitance measuring device being configured to measure the capacitance between the first and second electrodes (that is, the capacitance of the electrode pair). The comparator circuit compares the measured capacitance with the reference value, to thereby detect the lateral displacement of the workpiece in the planar direction of the support plate. In other words, the capacitance measured between the first and second electrodes changes depending on an area of the workpiece peripheral edge portion covering the electrode pair formed of the first and second electrodes, and hence the lateral displacement of the workpiece may be detected by comparing the measured capacitance with a reference capacitance value (reference value) obtained when the workpiece is held in a normal state on the support plate.

According to one embodiment of the present invention, it is preferred that each of the first and second electrodes be an annular electrode so that the electrode pair may be arranged continuous along the peripheral edge portion of the workpiece. Alternatively, a plurality of the electrode pairs may be arranged with respect to the peripheral edge portion of the workpiece. Among those forms, when a continuous electrode pair is configured so as to cover the entire peripheral edge portion of the workpiece, a slight change of the capacitance may be detected. Therefore, this form is suitable for a case where the lateral displacement of the workpiece with respect to the support plate is required to be determined more finely.

Meanwhile, when the plurality of the electrode pairs each including the first and second electrodes are arranged, for example, the electrode pairs may be suitably arranged at respective positions corresponding to four corners of a rectangular workpiece, or the electrode pairs may be suitably arranged at respective positions that equally divide a circumference of a circular workpiece into at least two parts. With this, the lateral displacement of the workpiece may be more correctly detected. In this case, it is preferred that the comparator circuit be individually mounted for each electrode pair. That is, when the capacitance between the first and second electrodes in each electrode pair is input to the individual comparator circuit so as to be compared with the reference value, the lateral displacement position of the workpiece may be specified.

According to one embodiment of the present invention, each of the first and second electrodes may be a band-like electrode. Further, the first and second electrodes may be arranged parallel to each other in the direction from the center of the workpiece toward the peripheral edge portion, to thereby form the electrode pair. In addition, the electrode pair may be mounted so that a part thereof is protruded outward from the peripheral edge portion of the workpiece. That is, the change in area of the workpiece peripheral edge portion covering the electrode pair may be defined as a continuous capacitance value, and hence the lateral displacement of the workpiece with respect to the support plate may be determined more finely.

The electrode pair formed of the first and second electrodes is preferred to be sandwiched between resin films or the like so as to be electrically insulated from the support plate and the workpiece. Further, it is preferred that at least one of the first and second electrodes be arranged at a position corresponding to the peripheral edge portion of the workpiece through intermediation of the adhesive pad. As described in detail later, for example, when the adhesive pad is made of silicone rubber, the dielectric constant thereof is generally 3 to 3.5 (incidentally, the dielectric constant of air is about 1.0). Therefore, when the adhesive pad is present between the workpiece and the first and/or second electrode(s), the capacitance measured between the first and second electrodes is accordingly increased. In other words, when the adhesive pad is interposed, the adhesive pad may function as a dielectric member. Thus, the capacitance may be significantly changed, and the detection accuracy may be enhanced.

According to one embodiment of the present invention, it is preferred that the adhesive pad to be mounted on the support plate express a pressure-sensitive adhesive force with respect to a plate-like or sheet-like workpiece such as a glass substrate, a plastic substrate, a semiconductor substrate, a sapphire substrate, a resin film, a resin base, or metal foil, that the adhesive pad be capable of holding the placed workpiece in a pressure-sensitive adhesive manner or holding the workpiece in a pressure-sensitive adhesive manner so as to prevent the workpiece from falling by its own weight when the workpiece is directed in the vertical direction, and that the adhesive pad enable repetitive mounting and removing of the workpiece.

A suitable example of such an adhesive pad may be a pad being formed of a resin material such as silicone rubber (silicone resin), styrene butadiene rubber, chlorosulfonated polyethylene rubber, acrylonitrile butadiene rubber, ethylene propylene rubber, chloroprene rubber, butadiene rubber, fluororubber, isobutylene isoprene rubber, or urethane rubber, and forming, on its surface, such fine protrusions as to have a fibrous structure of submicron order with a high aspect ratio. Further, as a commercial product of such an adhesive pad, for example, Silius (product name) manufactured by Fuso Rubber Co., Ltd. may be used. Note that, the structure of the adhesive pad for expressing the pressure-sensitive adhesive force is not particularly limited, but there may be given an intermolecular force (van der Waals force) as one example.

Further, the size, the shape, and the like of the adhesive pad are not particularly limited as long as the adhesive pad may hold the workpiece on the support plate. Further, the arrangement place of the adhesive pad on the support plate may be appropriately set in accordance with the type, the shape, and the like of the workpiece. Further, the support plate is not particularly limited as long as the support plate is made of a material having rigidity to an extent required as the workpiece holding apparatus, such as to an extent capable of maintaining the shape of the workpiece when the workpiece is processed or capable of moving integrally with the workpiece along with the transfer between the processes. Further, an arbitrary shape such as a circular shape and a rectangular shape may be appropriately selected for the support plate in accordance with the shape and the size of the workpiece.

Advantageous Effects of Invention

The workpiece holding apparatus according to the one embodiment of the present invention includes the capacitance measuring device including the electrode pair formed of the first and second electrodes and arranged at least at a part of the position corresponding to the peripheral edge portion of the workpiece. Therefore, when the comparator circuit compares the measured capacitance with the predetermined reference value, the lateral displacement of the workpiece in the planar direction of the support plate may be detected. Further, according to the method of detecting lateral displacement of a workpiece with use of the workpiece holding apparatus, the lateral displacement of the workpiece may be easily and instantaneously detected.

BRIEF DESCRIPTION OF DRAWINGS

FIGS. 1A, 1B and 1C are explanatory views illustrating a workpiece holding apparatus according to a first embodiment of the present invention, in which

FIGS. 2A and 2B are explanatory views illustrating a workpiece holding apparatus according to a second embodiment of the present invention, in which

FIGS. 4A and 4B are explanatory views illustrating a sensor unit employed in the third embodiment, in which

FIGS. 6A and 6B are explanatory views illustrating a test example for the workpiece holding apparatus according to the present invention, in which

DESCRIPTION OF EMBODIMENTS

Now, embodiments of the present invention are described with reference to the drawings. Note that, the present invention should not be interpreted as being limited to the following description.

EMBODIMENTS

First Embodiment

Figure 1A:
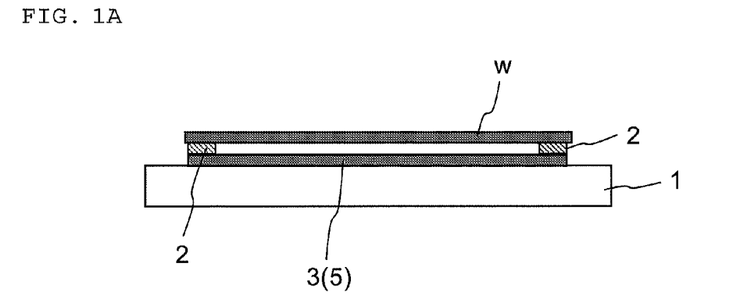
FIG. 1A is a side view.
Figure 1B:
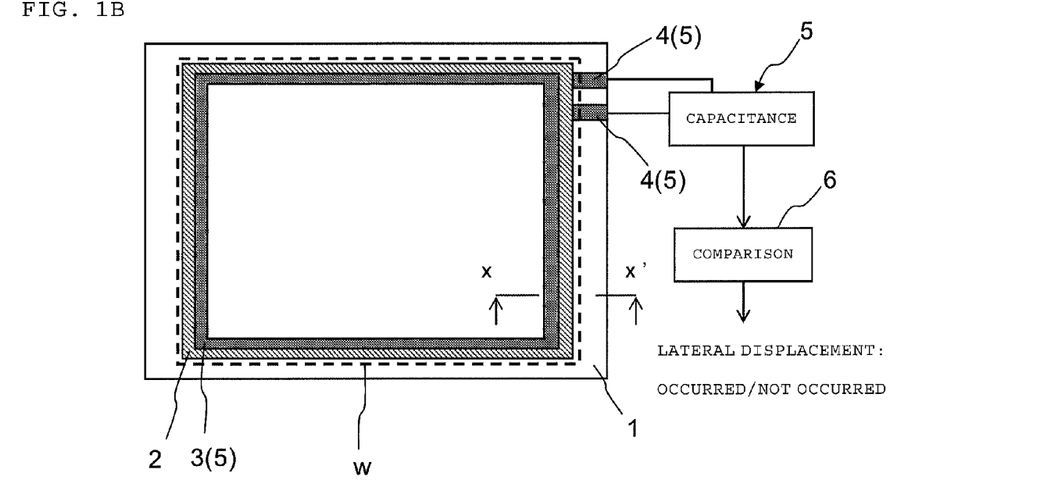
FIG. 1B is a plan view.
Figure 1C:
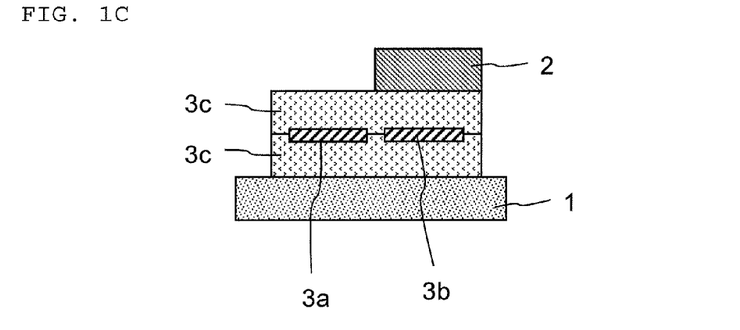
FIG. 1C is a partial sectional view (x-x').

FIGS. 1A, 1B and 1C illustrate a workpiece holding apparatus according to a first embodiment of the present invention. The workpiece holding apparatus includes a support plate 1, a capacitance measuring device 5, an adhesive pad 2, and a comparator circuit 6. The capacitance measuring device 5 includes an electrode pair formed of a first electrode 3a and a second electrode 3b and arranged along a peripheral edge portion of a rectangular workpiece to be held by the support plate 1, and is configured to measure capacitance between those electrodes 3a and 3b. The adhesive pad 2 is configured to hold a peripheral edge portion of a workpiece w in a pressure-sensitive adhesive manner. The comparator circuit 6 is configured to compare the capacitance measured by the capacitance measuring device 5 with a predetermined reference value.

In this case, regarding the capacitance measuring device 5 including the electrode pair formed of the first electrode 3a and the second electrode 3b, the first electrode 3a and the second electrode 3b forming the electrode pair are sandwiched between two insulating members 3c made of polyimide or the like, to thereby construct an annular sensor unit 3. This sensor unit 3 is arranged so as to correspond to the peripheral edge portion of the rectangular workpiece w through intermediation of the adhesive pad 2. The capacitance changes based on the difference in area of the workpiece peripheral edge portion covering the sensor unit 3, and hence every time the workpiece w is held, or when the workpiece w is processed or in the middle of conveyance, the capacitance is measured via sensor wiring 4 covered with an insulating member 3c similar to that described above.

The capacitance measured by the capacitance measuring device 5 is input to the comparator circuit 6 that receives power supply (not shown). The comparator circuit 6 stores in advance a reference capacitance value (reference value) obtained when the workpiece w is held in a correct state on the support plate 1. The comparator circuit 6 compares the measured capacitance with the reference value, to thereby enable instantaneous detection of occurrence or non-occurrence of the lateral displacement of the workpiece w in the planar direction of the support plate 1. At this time, the comparator circuit 6 may output a warning signal for notification of the lateral displacement of the workpiece w.

Second Embodiment

Figure 2A:
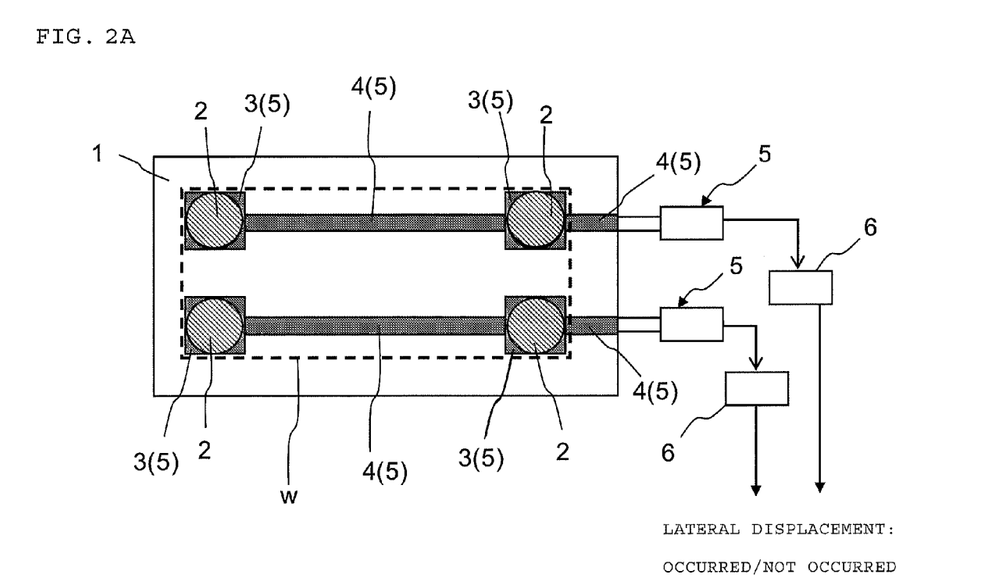
FIG. 2A is a plan view and FIG. 2B is an exploded view illustrating a sensor unit.
Figure 2B:
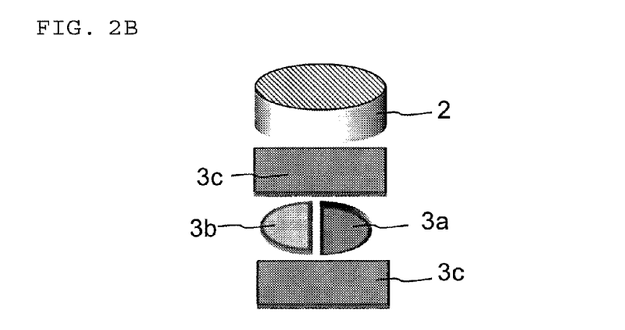

FIGS. 2A and 2B illustrate a workpiece holding apparatus according to a second embodiment of the present invention. This workpiece holding apparatus differs from the case of the workpiece holding apparatus according to the above-mentioned first embodiment in that the sensor units 3 are arranged at respective positions corresponding to the four corners of the rectangular workpiece. In each of those sensor units 3, the semicircular first electrode 3a and the semicircular second electrode 3b forming the electrode pair are sandwiched between the two insulating members 3c, to thereby construct a square sensor unit 3. Each two of those sensor units 3 are provided with the sensor wiring 4, to thereby form the capacitance measuring device 5. Each of the capacitance measuring devices 5 is connected to the comparator circuit 6.

Third and Fourth Embodiments

Figure 3:
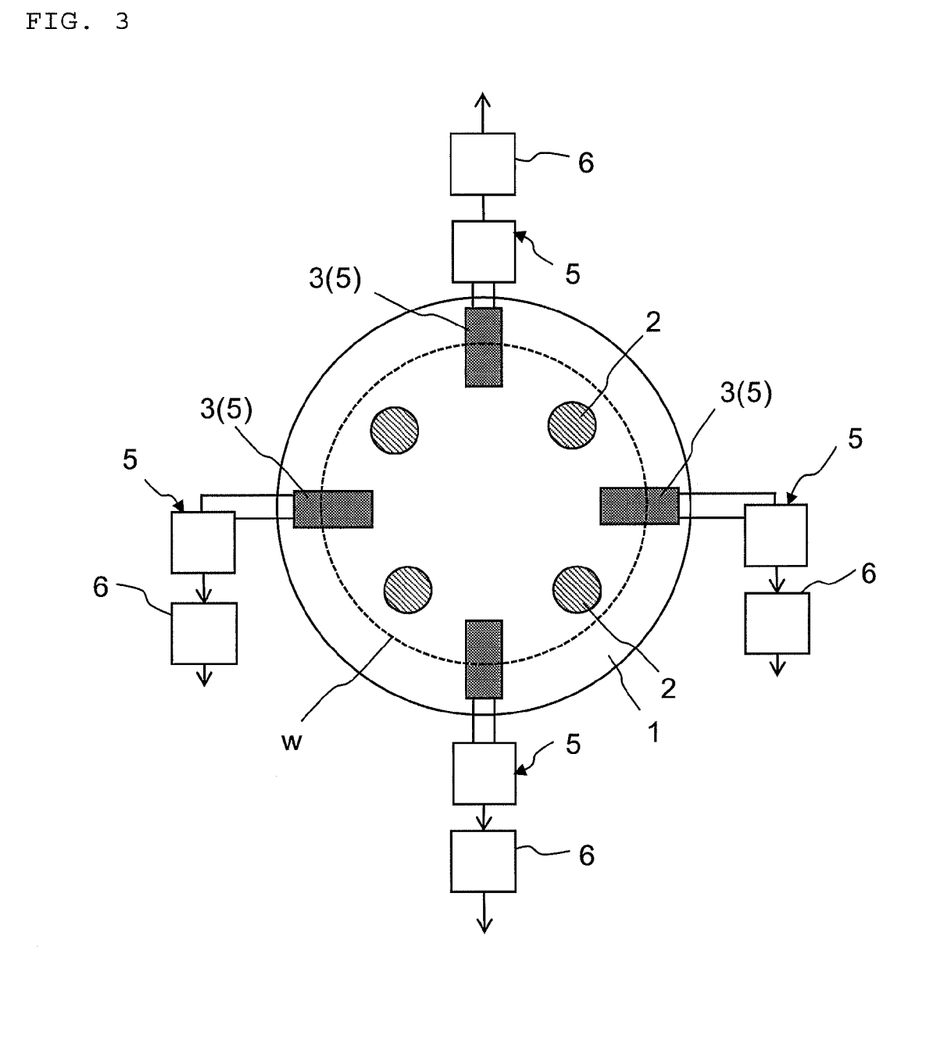
FIG. 3 is an explanatory view (plan view) illustrating a workpiece holding apparatus according to a third embodiment of the present invention.
Figure 4A:
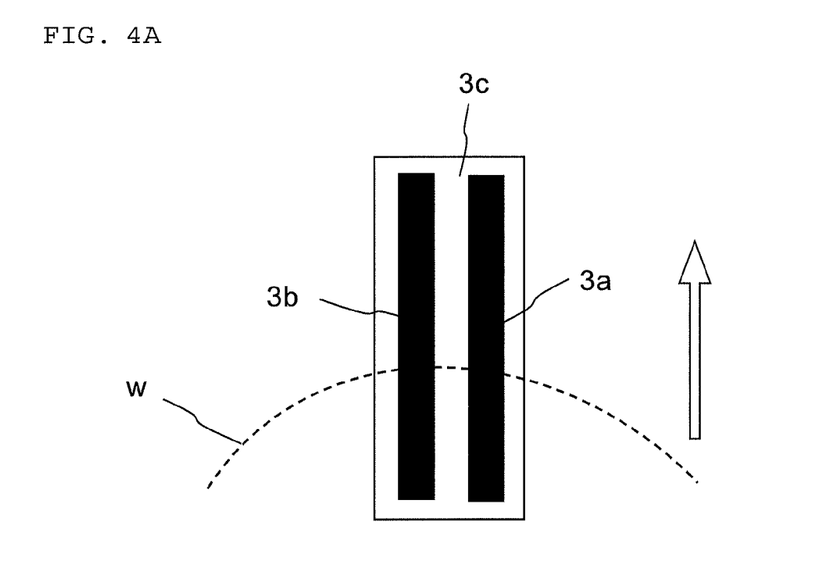
FIG. 4A is a plan view and FIG. 4B is a schematic view illustrating a positional relationship of a workpiece circumferential portion with respect to the sensor unit.

FIG. 3 illustrates a workpiece holding apparatus according to a third embodiment of the present invention. This workpiece holding apparatus differs from the case of the workpiece holding apparatus according to the above-mentioned first embodiment in that the sensor units 3 are arranged at positions that equally divide the circumference of a circular workpiece w into four parts, which are locations different from those of the adhesive pads 2. In each of those sensor units 3, as illustrated in FIG. 4A, the first electrode 3a and the second electrode 3b sandwiched between the two insulating members 3c are formed of band-like electrodes. The first and second electrodes 3a and 3b are arranged parallel to each other in a direction from the center of the circular workpiece w toward the peripheral edge portion thereof (direction of the arrow in FIG. 4A), to thereby form the electrode pair. Further, the electrode pair is mounted so that a part thereof is protruded outward from the peripheral edge portion of the workpiece w. Further, four capacitance measuring devices 5 each configured to measure the capacitance between the first and second electrodes 3a and 3b are constructed for the respective sensor units 3. The capacitance measured in each of the capacitance measuring devices 5 is input to the individual comparator circuit 6. Note that, when the sensor units 3 are mounted at locations different from those of the adhesive pads 2 as in this embodiment, for example, the adhesive pad 2 may be formed so as to be higher than the sensor unit 3 by about 0.01 to 5 mm, to thereby avoid contact between the workpiece w and the sensor unit 3.

Figure 4B:
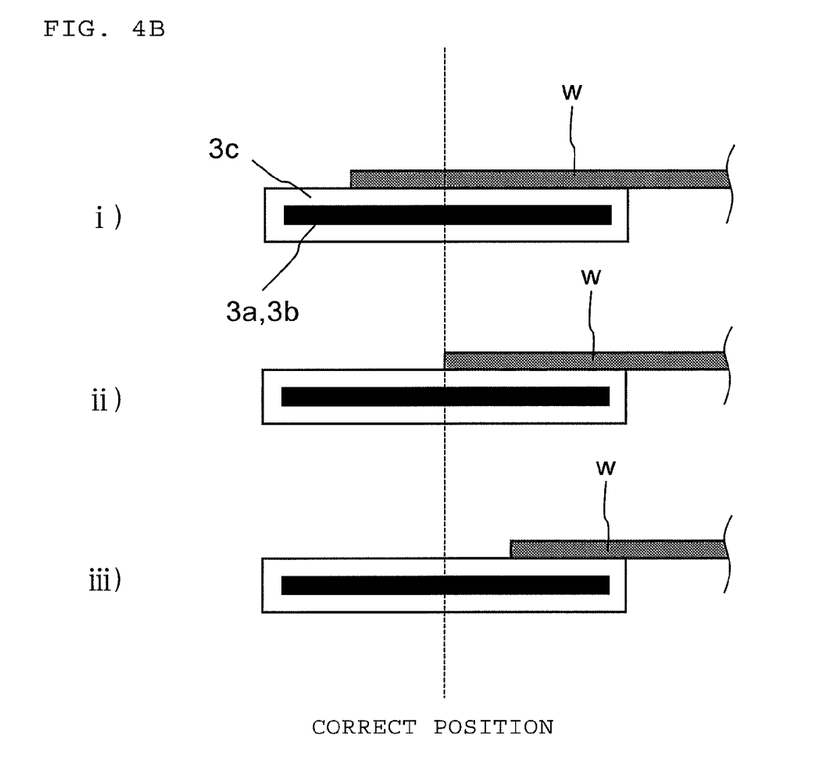

In the workpiece holding apparatus according to the third embodiment, as illustrated in FIG. 4B, when the capacitance measured in the state of ii) in which the workpiece w is held at a correct position on the support plate 1 is set as the reference value in each of the comparator circuits 6, the change in area of the workpiece peripheral edge portion covering the electrode pair in each sensor unit 3 can be defined as a continuous capacitance value, and hence the lateral displacement of the workpiece w with respect to the support plate 1 can be determined more finely. That is, in a certain sensor unit 3, when an end portion of the workpiece w is displaced outward from the correct position as illustrated in the state of i), or when the end portion of the workpiece w is displaced inward from the correct position as illustrated in the state of iii), based on the relationship with the capacitances measured by the remaining sensor units 3, the location of the lateral displacement of the workpiece w and the amount of the displacement can be specified.

Figure 5:
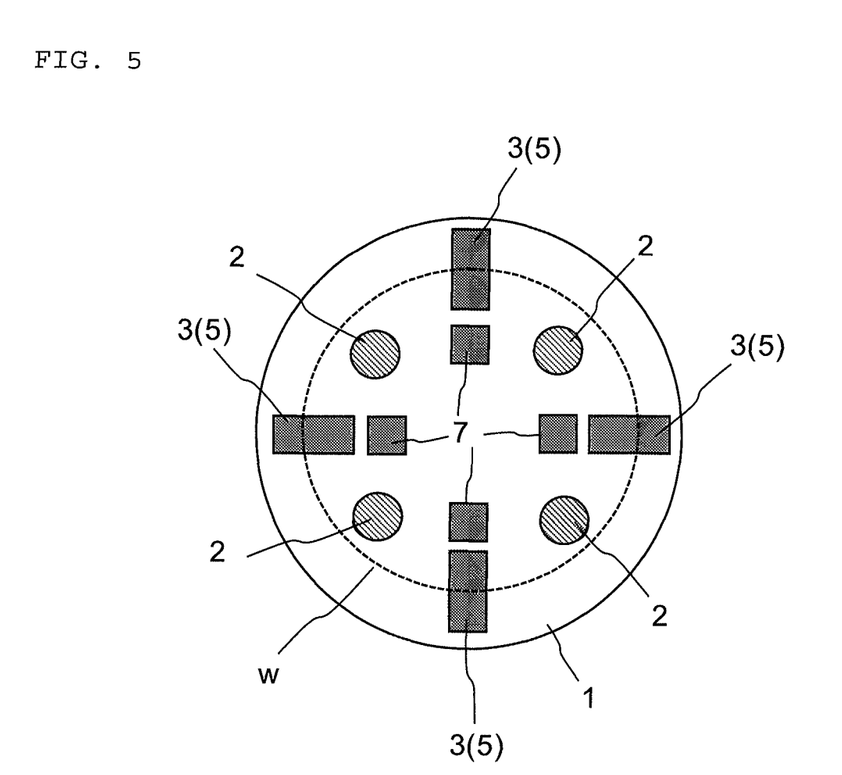
FIG. 5 is an explanatory view illustrating a workpiece holding apparatus according to a fourth embodiment of the present invention.

Further, FIG. 5 illustrates a workpiece holding apparatus according to a fourth embodiment of the present invention, in which height sensor units 7 are further arranged on the workpiece holding apparatus according to the above-mentioned third embodiment. The height sensor unit 7 is similar to the sensor unit 3 configured to detect the lateral displacement of the workpiece w in that the sensor unit includes the electrode pair formed of the first and second electrodes, but differs from the sensor unit 3 in that the height sensor unit 7 is mounted closer to the center of the workpiece than the sensor unit 3. That is, the capacitance measuring devices including those height sensor units 7 may be constructed, and the comparator circuits configured to input the measured capacitances may be separately provided (both not shown).

When this height sensor unit 7 is combined with the sensor unit 3 configured to detect the lateral displacement of the workpiece w, for example, the following determination can be carried out. That is, when the capacitance of the height sensor unit 7 is lower than a reference value, such an abnormality that a foreign matter is interposed between the adhesive pad 2 and the workpiece w or a material defect of the workpiece w itself may be assumed. Further, when the capacitance of the height sensor unit 7 is higher than the reference value, and the capacitance of the sensor unit 3 in the vicinity thereof is lower than the reference value, it is assumed that the workpiece w is not correctly held by the adhesive pad 2, and the workpiece has fallen onto the support plate 1.

(Test Example)

Figure 6A:
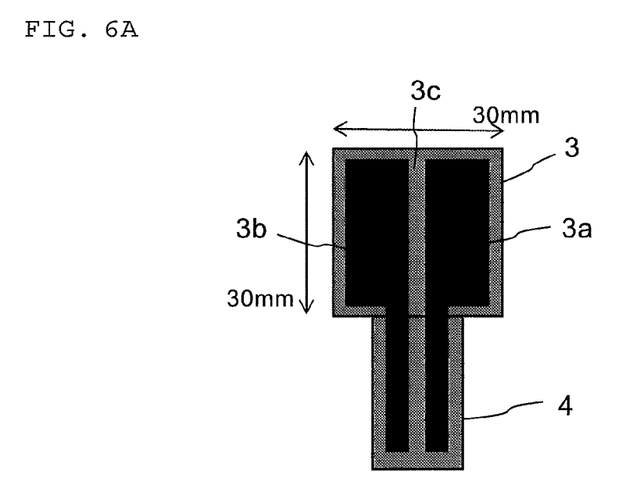
FIG. 6A is a schematic view illustrating a sensor unit and FIG. 6B is a schematic view illustrating a state of measuring capacitance.

The following test was carried out with use of the capacitance measuring device 5 including the sensor unit 3 including, as illustrated in FIG. 6A, the first and second electrodes 3a and 3b made of copper foil with a thickness of 12 μm. The first and second electrodes 3a and 3b were formed on the first polyimide film 3c with a thickness of 63 μm, and the second polyimide film 3c with a thickness of 50 μm was further laminated thereon. In this case, the sensor unit 3 has a size of 30 mm×30 mm. Further, the first and second electrodes 3a and 3b, which are each formed of a band-like electrode having a width of 9 mm and a length of 20 mm, are arranged parallel to each other, to thereby form the electrode pair. Further, the sensor wiring 4 is connected to the sensor unit 3. The sensor wiring 4 is obtained by covering connection lines extended from the first and second electrodes 3a and 3b with polyimide films similarly extended from the first and second first polyimide films 3c, to thereby enable measurement of the capacitance by the first and second electrodes 3a and 3b.

Figure 6B:
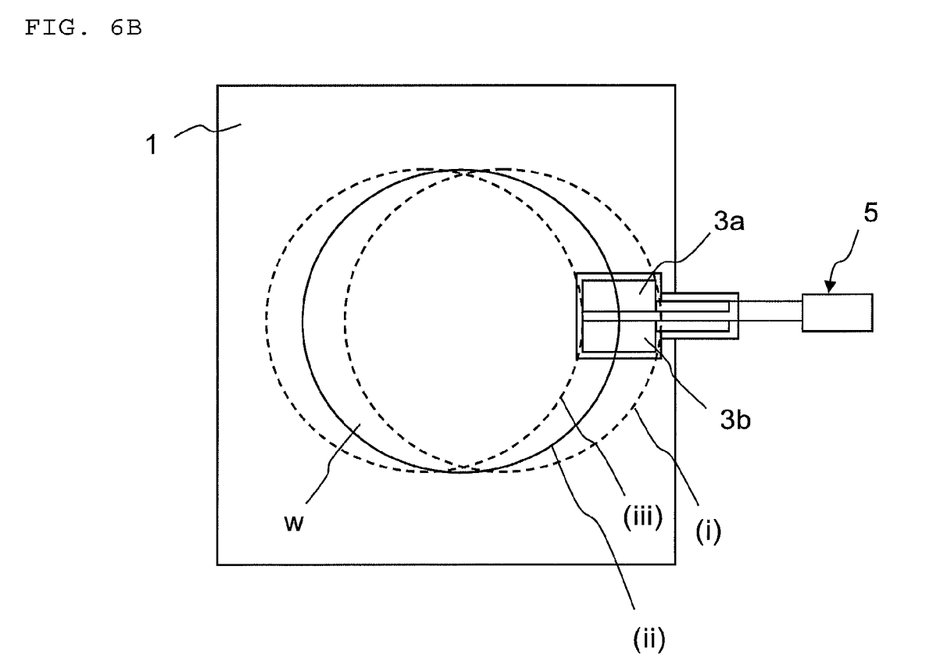

Double-sided tape (not shown) with a thickness of 150 μm was bonded on the first polyimide film 3c side of the sensor unit 3 in this capacitance measuring device 5, and the device was attached onto an aluminum plate with a thickness of 5 mm, which represented the support plate. Then, as illustrated in FIG. 6B, a silicon wafer (150 mm in diameter) was placed so that its outer peripheral portion overlapped the sensor unit 3, and the capacitance at that time was measured. First, the capacitance was 25 pF when the end of the silicon wafer was positioned substantially at the centers of the first and second band-like electrodes 3a and 3b in the length direction (state of (ii) in FIG. 6B). Further, the capacitance was 19.4 pF when the first and second band-like electrodes 3a and 3b were completely covered with the silicon wafer ((state of (i) in FIG. 6B)). Further, the capacitance was 29.7 pF when the end of the silicon wafer did not overlap the first and second band-like electrodes 3a and 3b ((state of (iii) in FIG. 6B)). That is, it is understood that the lateral displacement of the workpiece with respect to the support plate can be detected based on such difference in capacitance.

REFERENCE SIGNS LIST

1: support plate
2: adhesive pad
3: sensor unit
3a: first electrode
3b: second electrode
3: insulating member
4: sensor wiring
5: capacitance measuring device
6: comparator circuit
7: height sensor unit

The invention claimed is:

1. A workpiece holding apparatus, which is configured to hold a workpiece with an adhesive pad mounted on a support plate, the workpiece holding apparatus comprising:

a capacitance measuring device comprising an electrode pair formed of first and second electrodes and arranged at least at a part of a position corresponding to a peripheral edge portion of the workpiece, the capacitance measuring device being configured to measure capacitance of the electrode pair; and a comparator circuit configured to compare the measured capacitance with a predetermined reference value, to thereby detect lateral displacement of the workpiece in a planar direction of the support plate.

2. A workpiece holding apparatus according to claim 1, wherein at least one of the first and second electrodes is arranged at the position corresponding to the peripheral edge portion of the workpiece through intermediation of the adhesive pad.

3. A workpiece holding apparatus according to claim 1 or 2, wherein the electrode pair formed of the first and second electrodes is arranged continuous along the peripheral edge portion of the workpiece.

4. A workpiece holding apparatus according to claim 1 or 2,
wherein the first and second electrodes each comprise a band-like electrode,
wherein the first and second electrodes are arranged parallel to each other in a direction from a center of the workpiece toward the peripheral edge portion, to thereby form the electrode pair, and
wherein the electrode pair is mounted so that a part thereof is protruded outward from the peripheral edge portion of the workpiece.

5. A workpiece holding apparatus according to claim 1 or 2, wherein the electrode pair formed of the first and second electrodes is arranged at each of positions corresponding to four corners of a rectangular workpiece.

6. A workpiece holding apparatus according to claim 1 or 2, wherein the electrode pair formed of the first and second electrodes is arranged at each of positions that equally divide a circumference of a circular workpiece into at least two parts.

7. A workpiece holding apparatus according to claim 5, wherein the comparator circuit is individually mounted for each electrode pair.

8. A method of detecting lateral displacement of a workpiece in a planar direction of a support plate in a workpiece holding apparatus configured to hold the workpiece with an adhesive pad mounted on the support plate,
the workpiece holding apparatus comprising:
a capacitance measuring device comprising an electrode pair formed of first and second electrodes and arranged at least at a part of a position corresponding to a peripheral edge portion of the workpiece, the capacitance measuring device being configured to measure capacitance of the electrode pair; and
a comparator circuit configured to input the measured capacitance,
the method comprising comparing the capacitance input to the comparator circuit with a predetermined reference value, to thereby detect the lateral displacement of the workpiece.

9. A method of detecting lateral displacement of a workpiece according to claim 8,
wherein a plurality of the electrode pairs each formed of the first and second electrodes are arranged at positions corresponding to the peripheral edge portion of the workpiece, and
wherein the method further comprises inputting the capacitance between the first and second electrodes in each of the plurality of the electrode pairs to the individual comparator circuit, to thereby specify a lateral displacement position of the workpiece.

* * * * *